United States Patent [19]

Schilling

[11] 4,164,461

[45] Aug. 14, 1979

[54] SEMICONDUCTOR INTEGRATED CIRCUIT STRUCTURES AND MANUFACTURING METHODS

[75] Inventor: Hartmut Schilling, Boxboro, Mass.

[73] Assignee: Raytheon Company, Lexington, Mass.

[21] Appl. No.: 905,264

[22] Filed: May 12, 1978

Related U.S. Application Data

[62] Division of Ser. No. 756,508, Jan. 3, 1977, Pat. No. 4,107,726.

[51] Int. Cl.$^2$ .............................................. C23C 15/00
[52] U.S. Cl. .............................. 204/192 EC; 156/656; 204/192 C; 427/99
[58] Field of Search ........ 204/192 EC, 192 C, 192 E; 357/71; 156/643, 655, 656, 657; 427/96, 99

[56] References Cited

U.S. PATENT DOCUMENTS

| | | | |
|---|---|---|---|
| 3,881,971 | 5/1975 | Greer et al. ........................... | 156/657 |
| 4,113,578 | 9/1978 | Del Monte .............................. | 204/15 |

Primary Examiner—Aaron Weisstuch
Attorney, Agent, or Firm—Richard M. Sharkansky; Joseph D. Pannone

[57] ABSTRACT

A semiconductor integrated circuit structure wherein a first metal interconnecting system is formed on a semiconductor body having active and/or passive elements formed therein. An insulating layer is deposited on the first metal interconnecting system. Apertures are formed in selected regions of such layer and are cleaned in a sealed sputtering chamber. A refractory metal is deposited over the insulating layer and through the apertures onto the first metal interconnecting system in a sealed sputtering chamber. A lead metal is deposited over the refractory metal layer. Selected portions of such refractory metal and lead metal are removed to form a second metal interconnecting system. With such structure and method the surfaces of the first metal interconnecting system which are to be connected to a second metal interconnecting system through the apertures are cleaned of oxides and other contaminates in a sealed sputtering chamber and are then sealed from further contamination by the refractory metal layer. The method improves the electromigration resistance of the second metal interconnecting system because of the presence of the refractory metal layer. Further, the refractory metal layer acts as a barrier layer which reduces interdiffusion between the connected portions of the first and second interconnecting systems. The assurance of good ohmic contact between the connected portions of the interconnecting systems reduces the surface area required for metallization.

7 Claims, 5 Drawing Figures

SEMICONDUCTOR INTEGRATED CIRCUIT STRUCTURES AND MANUFACTURING METHODS

CROSS-REFERENCE TO RELATED APPLICATIONS

This is a division of application Ser. No. 756,508, filed Jan. 3, 1977, now U.S. Pat. No. 4,107,726.

BACKGROUND OF THE INVENTION

This invention relates generally to semiconductor integrated circuit structures and manufacturing methods and more particularly to semiconductor integrated circuit structures having multiple layer metal conductors and manufacturing methods therefor.

As is known in the art, semiconductor integrated circuits have been formed by depositing metal on the surface of an oxide mask and through apertures formed in such mask to selected regions of active elements formed as a single crystal body. One such metal is aluminum and the resulting metallization forms a first metal interconnecting system. A second metal interconnecting system is formed on a second oxide mask which is deposited over the first metal interconnecting system, and through apertures formed in such second oxide mask to selected conductors of the first metal interconnecting system. Because aluminum is a reactive metal, the use of such metal as the second interconnecting metal results in compounds, such as oxides, being formed between the aluminum-aluminum metal interconnecting layers, thereby preventing complete, reproducible ohmic via contacts from being formed between such first and second metal interconnecting systems.

SUMMARY OF THE INVENTION

In accordance with this invention, a first metal interconnecting system is formed on a semiconductor body having active and/or passive elements formed therein, an insulating layer is deposited on the first metal interconnecting system, apertures are formed in selected regions of such insulating layer, such apertures are cleaned in a sealed sputtering chamber, a refractory metal is deposited over such insulating layer and through the apertures onto the first metal interconnecting system in a sealed sputtering chamber, a lead metal is deposited over the refractory metal layer, and selected portions of such refractory metal and lead metal are removed to form a second metal interconnecting system.

In a preferred embodiment of the invention, the lead metal used for both the first and second metal interconnecting systems is aluminum and the refractory metal is titanium, tungsten, or a mixture of titanium and tungsten. With such method, the surfaces of the aluminum in the first metal interconnecting system exposed by the apertures formed in the dielectric layer are cleaned of oxides and other contaminates in a sealed sputtering chamber and then sealed from further contamination by the refractory metal while the semiconductor body is still in the sealed sputtering chamber. That is, the refractory metal acts as a barrier layer which reduces interdiffusion between the first and second aluminum layers. The assurance of good ohmic contact between the two aluminum layers reduces the surface area required for metallization because the contact area at the interconnecting surfaces of the two aluminum layers is reduced.

BRIEF DESCRIPTION OF THE DRAWINGS

The foregoing features of this invention, as well as the invention itself, may be fully understood from the following description read together with the accompanying drawings in which.

DESCRIPTION OF THE PREFERRED EMBODIMENTS

Figure 1A:
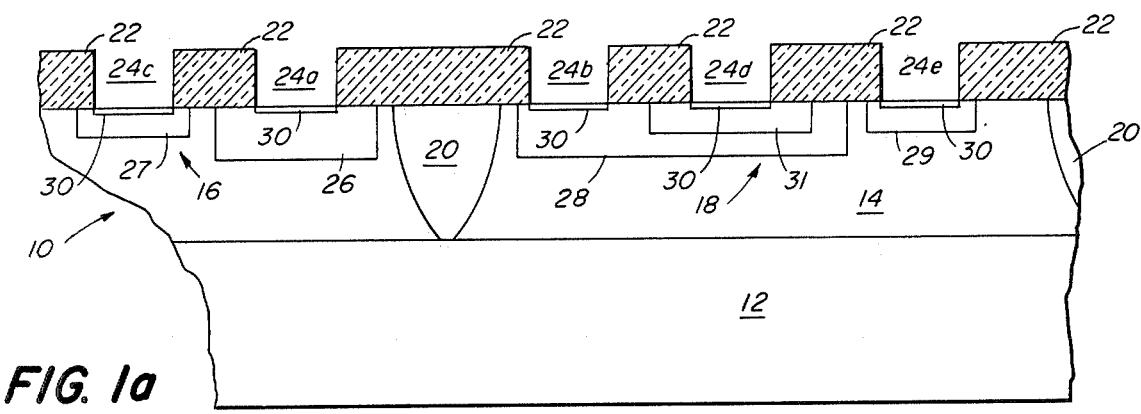
FIGS. 1a–1d are cross-sectional elevation views, greatly distorted, of a portion of an integrated circuit according to the invention at various steps in the manufacture thereof.

Referring now to FIG. 1a, there is shown a semiconductor body 10 having a silicon wafer 12, here a three inch diameter wafer of P type conductivity, an epitaxial layer 14, here of N type conductivity, formed on such wafer 12, and a plurality of semiconductor elements 16, 18 formed in such epitaxial layer 14 and isolated from each other, here by junction isolation provided by diffused P type conductivity regions 20, all of which are formed by using any conventional process. As illustrated therein, the active semiconductor elements include a diode and a transistor; however, it should be noted that any desired active and/or passive element may be formed in the semiconductor body 10 in accordance with well-known principles. Other methods, such as dielectric isolation, may be used to isolate devices as described in U.S. Pat. No. 3,947,298, entitled "Method of Forming Junction Regions Utilizing R.F. Sputtering," inventor Karl H. Tiefert, issued Mar. 30, 1976, and assigned to the same assignee as the present invention. A dielectric layer 22, here a 10,000 Å thick layer of silicon dioxide, is formed on the surface of the epitaxial layer 14 using any conventional process, here using chemical vapor deposition. Apertures 24a, 24b are formed in the dielectric layer 22 to expose portions of P type conductivity regions 26, 28 which are diffused into the epitaxial layer 14 using any conventional process. Apertures 24c, 24d, and 24e are formed in dielectric layer 22 to expose portions of N+ type conductivity regions 27, 29 and N type conductivity emitter region 31 which are diffused into the epitaxial layer 14 using any conventional process. Such regions 26, 27, 28, 29, 31 are exposed where ohmic contact is to be made with the first metal interconnecting system in the manner to be described. The apertures 24a, 24b, 24c, 24d, 24e are formed in accordance with well-known practice by use of conventional photolithography and a hydrofluoric acid (HF) etchant. A film of platinum (not shown) is deposited over the dielectric layer 22 and over the P type conductivity regions 26, 28 through apertures 24a, 24b and N+ conductivity regions 27, 29 and N type conductivity emitter region 31 through apertures 24c, 24e, and 24d. The semiconductor body 10 is heated to a temperature, here 500° C., to sinter the platinum film and to form regions 30 of platinum-silicide in accordance with well-known practice. Any excess platinum is removed using an aqua rega solution ($3HCL + HNO_3$) (the platinum-silicide being insoluble in such solution), in accordance with well-known practice.

Figure 1B:
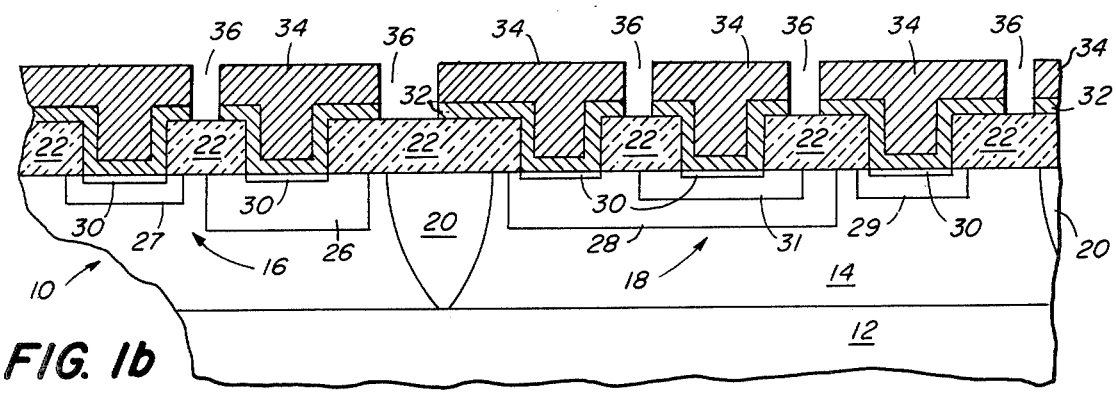

Referring now to FIG. 1b, the semiconductor body 10 has a refractory metal, here titanium, formed as a thin layer 32, here 1800–2000 Å thick, over the dielectric layer 22 and on the portions of the semiconductor body 10 which are exposed by apertures 24a–24e (FIG.

1a). Such refractory metal layer 32 is here sputtered onto layer 22 and the exposed portions of semiconductor body 10 by a sputtering process in accordance with well-known practice. A lead metal layer 34, here aluminum, is formed over the titanium refractory metal layer 32 using any conventional process, here by depositing vaporized aluminum on the titanium refractory metal layer 32 to a thickness here of 8500 A. After the aluminum lead metal layer 34 is deposited on the surface of the refractory metal layer 32, such lead metal layer 34 is coated with a suitable photoresist, exposed to a first metal interconnecting system mask, not shown, developed and etched with an appropriate etchant, here a solution of 1200 ml $H_3PO_4$ 300 ml $CH_3COOH$ and 200 ml $HNO_3$, to remove the aluminum in unwanted regions 36, as shown. The titanium refractory metal layer 32 is selectively etched using a suitable etchant, here a solution of hydrogen peroxide ($H_2O_2$), in accordance with well-known practice to remove the titanium from unwanted regions 36, as shown thereby, to form the first metal interconnecting system. Alternatively, the unwanted regions of titanium layer 32 may be removed using plasma etching in accordance with well-known practice.

Figure 1C:
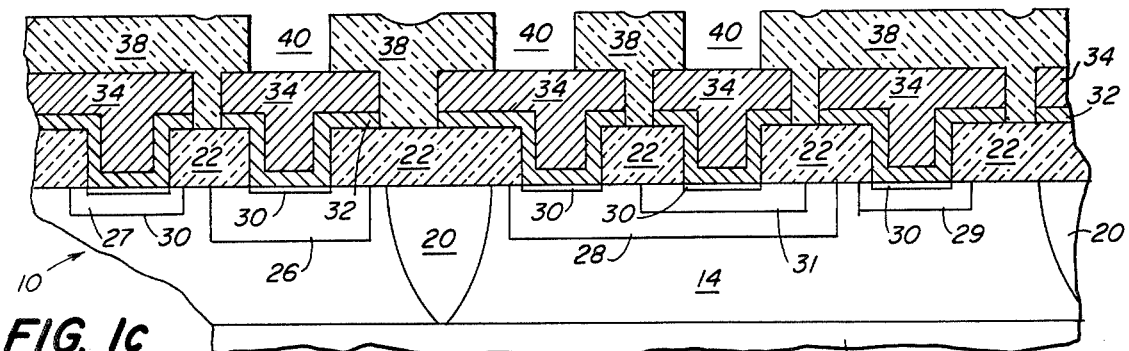

Referring now to FIG. 1c, a second dielectric layer 38, here a 9000 A thick layer of silicon dioxide, is formed over the lead metal layer 34 and the exposed portions of dielectric layer 22 (i.e., into regions 36) using any conventional process, here chemical vapor deposition. It is here noted that the silicon dioxide forming the dielectric layer 38 is doped with 4% phosphorous to improve the thermal coefficient of expansion of such second dielectric layer 38. The second dielectric layer 38 is then coated with a suitable photoresist, masked with a second metal interconnecting system mask (not shown), exposed, developed, and etched with a solution, here of 2470 ml $CH_3COOH$, 485 ml $NH_4F$ and 2925 ml $H_2O$, to form apertures 40 in the second dielectric layer 38 as indicated.

Figure 2:
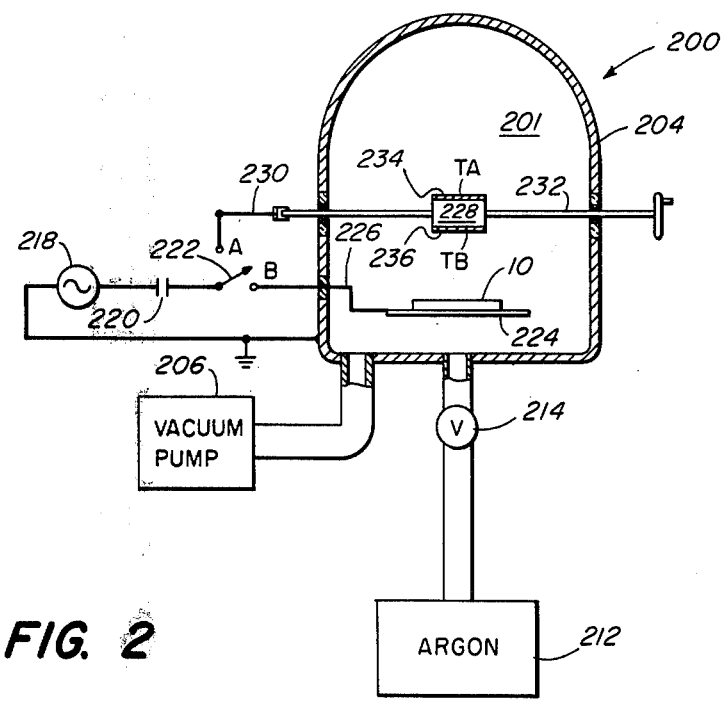
FIG. 2 shows in diagrammatic form apparatus suitable for practice of the invention.

The semiconductor body is then placed in a sputtering apparatus 200 as indicated in FIG. 2. A suitable sputtering apparatus is Model 8800 manufactured by Materials Research Corp., Orangeburg, New York. The sputtering apparatus 200 has a chamber 201 enclosed or sealed from the atmosphere by a stainless steel enclosure 204. A vacuum or exhaust pump 206 is used to exhaust gases from the enclosed chamber 201. A supply 212 of a nobel gas, here argon, is coupled to chamber 201 through a valve 214. A suitable radio frequency (R.F.) source 218 is coupled to the stainless steel enclosure 204 and to one electrode of a capacitor 220, as indicated. The second electrode of the capacitor 220 is adapted to be coupled to either terminal A or terminal B by the switch 222, as indicated. Terminal B is coupled to a substrate holder 224 by a wire 226 which passes through enclosure 204 but which is electrically insulated from such enclosure 204 by a suitable feedthrough, not shown.

Terminal A is coupled to a target holder 228 by a wire 230 which passes through enclosure 204 but which is electrically insulated from such enclosure 204 by a suitable feedthrough, not shown. Target holder 228 is adapted to rotate about the longitudinal axis of a rod 232 so that either a first target, $T_A$, suitably mounted to face 234 of target holder 228 or a second target, $T_B$, suitably mounted to face 236 may be positioned to face the surface of the semiconductor body 10, which is suitably affixed to the substrate holder 224. Here the target $T_B$ mounted to face 236 of target holder 228 is stainless steel and the target $T_A$ mounted to face 234 of target holder 228 is titanium (alternatively a mixture of titanium and tungsten). As shown in FIG. 2, the stainless steel target $T_B$ is positioned to face that surface of the semiconductor body 10 which has the second dielectric layer 38 (FIG. 1c) formed thereon.

Figure 1D:
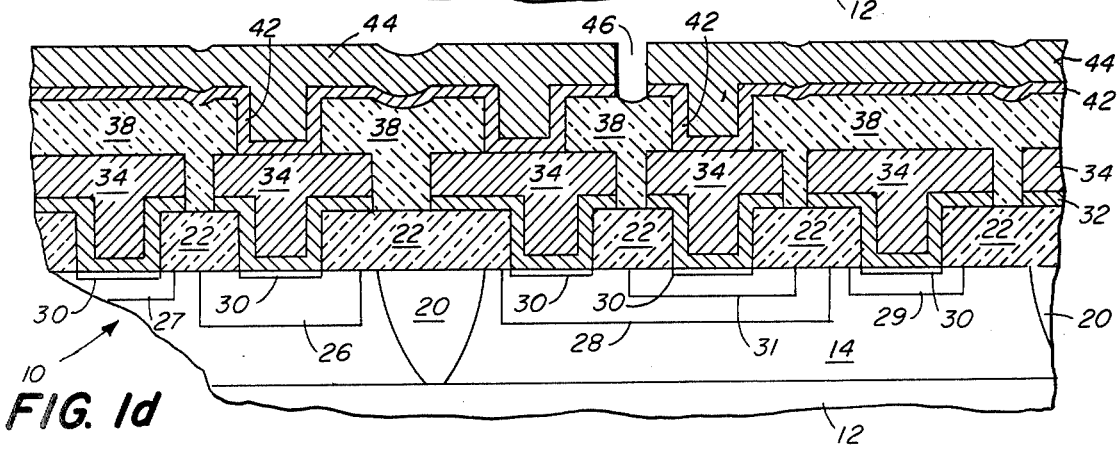

Having placed the semiconductor body 10, stainless steel target $T_B$ and titanium target $T_A$ in the sputtering apparatus 200 as indicated in FIG. 2 (i.e., with the stainless steel target $T_B$ facing the dielectrically coated surface of semiconductor body 10), the chamber 201 is evacuated to a vacuum, here of $1 \times 10^{-6}$ Torr, by the pump 206 and then such chamber 201 is backfilled with argon from supply 212 to a pressure, here of $5 \times 10^{-3}$ Torr, by valve 214. Switch 222 is positioned to connect terminal B to capacitor 220. During this sputtering operation, the portions of the aluminum lead metal layer 34 which are exposed by apertures 40 (FIG. 1c) are cleaned of oxides and other contaminates by bombardment of argon ions produced in the chamber 201. That is, any aluminum oxide formed on the portions of the aluminum lead metal layer 34 and any residual silicon dioxide of the second dielectric layer 38 which may have remained in the apertures 40 are knocked out by the impinging argon ions and are deposited on the face of the stainless steel target $T_B$. The cleaning process occurs for a suitable period of time, here two minutes at 200 watts of power for the three inch wafer semiconductor body 10. Then, without removing semiconductor body 10 or otherwise opening the chamber 201 to the atmosphere, switch 222 is positioned to connect terminal A to capacitor 220. In operation, argon ions now bombard the titanium target, $T_A$, to clean the surface of such target $T_A$ from any titanium oxide which may have been formed during the cleaning process described above. That is, the titanium dioxide atoms are dislodged from the titanium target $T_A$ by impinging argon ions and are deposited on the upper, inner surface of the stainless steel enclosure 204. Having cleaned the surface of target $T_A$, the rod 232 is rotated by any suitable means (not shown) from outside the chamber 201, say manually, 180 degrees to position the face 234, and hence the titanium target $T_A$, opposite the semiconductor body 10. It is noted that, during this positioning (i.e., rotating process), the enclosure 204 maintains the argon environment in the sealed chamber 201 and therefore prevents oxygen or other contaminants in the atmosphere from being introduced to the chamber 201. Now again, ions bombard the titanium target, $T_A$, dislodge the titanium atoms and such atoms become deposited on the opposing surface of the semiconductor body 10 to form a refractory metal layer 42, here titanium 1800 Å thick, over the silicon dioxide second dielectric layer 38 and the portions of the aluminum lead metal layer 34 which are exposed by the apertures 40 (FIG. 1c) as indicated in FIG. 1d. Here the sputtering deposition of titanium occurs for ten minutes at a power of 1,000 watts.

Using the process just described, the exposed surfaces of the aluminum lead metal layer 34 (i.e., the surfaces of the first metal interconnecting system which are to be formed in ohmic contact with the second metal interconnecting system) are cleaned of oxides and other contaminates and then sealed from further contamination by this titanium refractory metal layer 42 which is sputtered on in a "contaminate free" environment, i.e., while the chamber 201 is sealed.

The semiconductor body 10 is removed from the chamber 201 and a second lead metal layer 44, here aluminum, is formed on the titanium refractory metal layer 42, here, for example, a 1.2 μm thick aluminum layer 44 is formed by depositing vaporized aluminum on the titanium refractory metal layer 42. It is noted that, by forming the titanium refractory metal layer 42 in the sealed environment of the chamber 201, as described above in connection with FIG. 2, the refractory metal layer 42 acts as a barrier layer and prohibits interdiffusion of the first and second aluminum lead metal layers 34, 44. Further, such process ensures that there is good ohmic contact between the first and second metal interconnecting systems. This reduces the surface area required for metallization because contact areas of the interconnecting surfaces of the two metal interconnecting systems may be reduced.

The second metal interconnecting system is formed after the second aluminum lead metal layer 44 is deposited, as described, by coating such layer 44 with a suitable layer of photoresist, exposing such coated surface with a second metal interconnecting system mask (not shown), developing such exposed and coated surface in any conventional manner, and etching the aluminum to form apertures 46 as indicated, using a suitable etching solution, here a solution of 1800 ml $H_3PO_4$, 340 ml $CH_3COOH$ and 35 ml $HNO_3$. The titanium refractory metal layer 42 is etched to form apertures 46 using a suitable etchant, here a solution of hydrogen peroxide $H_2O_2$, to form the structure as indicated in FIG. 1d. Alternatively, a conventional plasma etching process may be used to prevent undercutting of the aluminum.

It has been found that the described structure and method improved the electromigration resistance of the second aluminum layer 44 because of the presence of the refractory metal layer 42. Further, the refractory metal layer 42 acts as a barrier layer which reduces interdiffusion between the aluminum layers 34, 44. The assurance of good ohmic contact between the two aluminum layers 34, 44 reduces the surface area required for metallization because the contact area at the interconnecting surfaces of the two aluminum layers is reduced. Further, it has been found that the interface electrical resistance of the refractory metal-aluminum metal layers is improved using tungsten and aluminum in discrete layers.

Having described a preferred embodiment of this invention, it is evident that other embodiments incorporating these concepts may be used. For example, while the same sputtering apparatus was used for both the cleaning process and the refractory metal layer 42 deposition process, different apparatus may be used by transferring the semiconductor body 10 between such different apparatus in a substantially "contaminate free" environment. Further, other refractory metals such as chromium, molybdenum, hafnium, zirconium and tantalum may be used. Still further, with suitable sputtering chambers, the cleaning process, refractory metal deposition process and second aluminum lead metal layer deposition process may all be performed in such sputtering chambers. It is felt, therefore, that this invention should not be restricted to the disclosed embodiments but rather should be limited only by the spirit and scope of the appended claims.

What is claimed is:

1. A method of forming a multiple layer interconnecting system for a semiconductor integrated circuit comprising the steps of:
    forming a first aluminum lead metal layer into a first interconnecting system on a semiconductor body;
    depositing an insulating layer on the first interconnecting system;
    forming apertures in selected regions of such insulating layer to expose portions of the first aluminum lead metal layer of the first interconnecting system;
    depositing a refractory metal layer over the insulating layer and through the apertures onto selected regions of the first aluminum lead metal layer of the first interconnecting system; and
    depositing a second aluminum lead metal layer over the refractory metal layer, and removing selected portions of the refractory metal layer and the second aluminum lead metal layer to form a second interconnecting system.

2. The method recited in claim 1 wherein the aperture forming step comprises the step of sputter cleaning the portions of the first aluminum lead metal layer and wherein the refractory metal depositing step includes the step of sputter depositing said refractory metal on said sputter cleaned portions of said first aluminum lead metal layer.

3. The method recited in claim 2 wherein the cleaning step and the refractory metal depositing step are performed in the same sputtering chamber.

4. A method of forming a multiple layer interconnecting system for a semiconductor integrated circuit comprising the steps of:
    forming a lead metal into a first interconnecting system on a semiconductor body;
    depositing an insulating layer on the lead metal of the first interconnecting system;
    forming apertures in selected regions of such insulating layer to expose portions of the lead metal of the first interconnecting system;
    sputter depositing a refractory metal over the insulating layer and through the apertures onto selected regions of the lead metal of the first interconnecting system;
    depositing the same lead metal over the refractory metal layer and removing selected portions of the refractory metal layer and the lead metal deposited over the refractory metal to form a second interconnecting system; and
    wherein the aperture forming step comprises the step of sputter cleaning the portions of the lead metal of the first interconnecting system and wherein the refractory metal is sputter deposited on the sputter cleaned portions of the lead metal of the first interconnecting system.

5. The method recited in claim 4 wherein the step of depositing the lead metal comprises the step of depositing a layer of aluminum.

6. The method recited in claim 4 wherein the sputter cleaning step and the refractory metal sputter depositing step are performed in the same sputtering chamber.

7. The method recited in claim 4 wherein the step of sputter depositing a refractory metal includes the step of depositing a metal of the group consisting of titanium, tungsten, chromium, molybdenum, hafnium, zirconium, and tantalum.

* * * * *